(12) United States Patent
Seshadri et al.

(10) Patent No.: US 8,891,287 B2
(45) Date of Patent: *Nov. 18, 2014

(54) SRAM CELL HAVING A P-WELL BIAS

(75) Inventors: Anand Seshadri, Richardson, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 113 days.

This patent is subject to a terminal disclaimer.

(21) Appl. No.: 13/196,010

(22) Filed: Aug. 2, 2011

(65) Prior Publication Data

US 2012/0195108 A1 Aug. 2, 2012

Related U.S. Application Data

(60) Provisional application No. 61/414,200, filed on Nov. 16, 2010.

(51) Int. Cl.
*G11C 11/40* (2006.01)
*G11C 11/412* (2006.01)
*G11C 11/419* (2006.01)

(52) U.S. Cl.
CPC .......... *G11C 11/412* (2013.01); *G11C 11/419* (2013.01)
USPC ........................................ 365/154

(58) Field of Classification Search
None
See application file for complete search history.

(56) References Cited

U.S. PATENT DOCUMENTS

| 5,706,226 | A  | * | 1/1998 | Chan et al. ..................... 365/156 |
| 7,164,596 | B1 | * | 1/2007 | Deng et al. ..................... 365/154 |
| 7,365,432 | B2 |   | 4/2008 | Liaw |
| 2008/0144365 | A1 | * | 6/2008 | Yamaoka et al. ............. 365/181 |
| 2009/0109732 | A1 | * | 4/2009 | Houston ........................ 365/154 |

* cited by examiner

*Primary Examiner* — James G Norman
(74) *Attorney, Agent, or Firm* — Rose Alyssa Keagy; Frederick J. Telecky, Jr.

(57) ABSTRACT

A process of performing an SRAM single sided write operation including applying a positive bias increment to an isolated p-well containing a passgate in an addressed SRAM cell. A process of performing an SRAM single sided read operation including applying a negative bias increment to an isolated p-well containing a driver in an addressed SRAM cell. A process of performing an SRAM double sided write operation including applying a positive bias increment to an isolated p-well containing a passgate connected to a low data line in an addressed SRAM cell. A process of performing an SRAM double sided read operation including applying a negative bias increment to an isolated p-well containing a bit driver and applying a negative bias increment to an isolated p-well containing a bit-bar driver in an addressed SRAM cell.

26 Claims, 7 Drawing Sheets

US 8,891,287 B2

SRAM CELL HAVING A P-WELL BIAS

CROSS-REFERENCE TO RELATED APPLICATIONS

This application claims the benefit of priority under U.S.C. §119(e) of U.S. Provisional Application 61/414,200 (filed Nov. 16, 2010, and titled "SRAM Cells With Isolated P-Wells").

Moreover, this application is related to patent application Ser. No. 13/196,042 entitled "SRAM Cell Having An N-Well Bias", and patent application Ser. No. 13/196,058 entitled "Bias Voltage Source". With their mention in this section, these patent applications are not admitted to be prior art with respect to the present application.

BACKGROUND

This invention relates to the field of integrated circuits. More particularly, this invention relates to static random access memory (SRAM) cells in integrated circuits.

DETAILED DESCRIPTION

Figure 1:
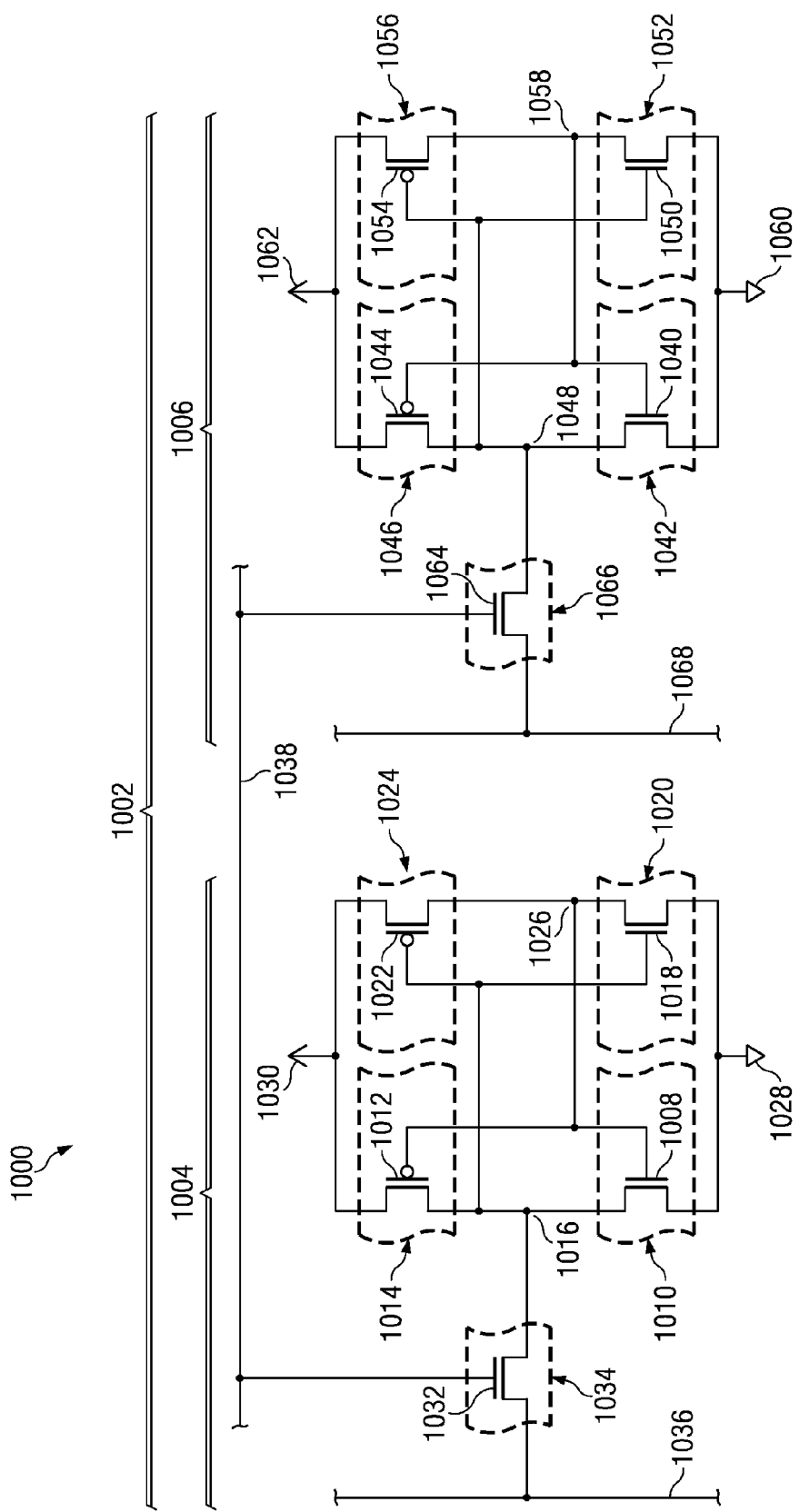
FIG. 1 is a circuit diagram of an integrated circuit containing an array of SRAM cells configured for single sided write and read operations.

The example embodiments are described with reference to the attached figures, wherein like reference numerals are used throughout the figures to designate similar or equivalent elements. The figures are not drawn to scale and they are provided merely to illustrate the example embodiments. Several aspects are described below with reference to example applications for illustration. It should be understood that numerous specific details, relationships, and methods are set forth to provide a full understanding of the example embodiments. One skilled in the relevant art, however, will readily recognize that the example embodiments can be practiced without one or more of the specific details or with other methods. In other instances, well-known structures or operations are not shown in detail to avoid obscuring the embodiment. The example embodiments are not limited by the illustrated ordering of acts or events, as some acts may occur in different orders and/or concurrently with other acts or events. Furthermore, not all illustrated acts or events are required to implement a methodology in accordance with the example embodiments.

For the purposes of this disclosure, the term "Vdd" is understood to refer to a power supply node with a potential suitable for source nodes of p-channel metal oxide semiconductor (PMOS) transistors. Conversely, the term "Vss" is understood to refer to a power supply node with a potential suitable for source nodes of n-channel metal oxide semiconductor (NMOS) transistors, and is lower than the Vdd potential. The term "floated" is understood to mean disconnected from a voltage source such as Vdd or Vss, or alternatively, connected to a voltage source through a high impedance component (e.g. a transistor, a resistor or a diode) so as to limit the charge accumulation on a floated node.

In addition, the term "Vtn" is understood to mean an average threshold voltage of the NMOS transistors in inverters of SRAM cells. Conversely, the term "Vtp" is understood to mean an average threshold voltage magnitude of the PMOS transistors in inverters of SRAM cells.

Furthermore, the term "driver transistor" is understood to refer to an NMOS transistor in an SRAM cell. Specifically, a drain node of the driver transistor is connected to a state node of the SRAM cell, a gate node of the driver transistor is connected to an opposite state node of the same SRAM cell, and a source node of the driver transistor is connected to a Vss node. The driver transistor is formed in a p-type well ("p-well").

Conversely, the term "load transistor" is understood to refer to a PMOS transistor in the SRAM cell. Specifically, a drain node of the load transistor is connected to a state node of the SRAM cell, a gate node of the load transistor is connected to an opposite state node of the same SRAM cell, and a source node of the load transistor is connected to a Vdd supply node. The load transistor is formed in an n-type well ("n-well").

The term "passgate transistor" is understood to refer to yet another NMOS transistor in an SRAM cell. One source/drain node of the passgate transistor is connected to a state node of the SRAM cell, while the other source/drain node of the passgate transistor is connected to a data line of the SRAM cell. The passgate transistor is also formed in a p-well. In addition, the term "word line" is understood to mean an interconnect element connected to the gate node of passgate transistors that are located within a row of SRAM cells.

Moreover, the term "bit-side" is understood to refer to components (such as a driver transistor, a load transistor, and a passgate transistor) that are coupled a state node in an SRAM cell. Conversely, the term "bit-bar-side" is understood to refer to components that are coupled to an opposite state node of the same SRAM cell. Note that the term "complementary" is understood to refer to two similar components of which a first component of the two is coupled to a state node of an SRAM cell and a second component of the two is coupled to an opposite state node of the same SRAM cell.

For the purposes of this disclosure, the term "addressed SRAM cell" is understood to refer to an SRAM cell in which a passgate transistor is turned on, while one or more data lines of the addressed SRAM cell are connected to read circuitry or write circuitry. In addition, the term "half-addressed SRAM cell" is understood to refer to an SRAM cell in which a passgate transistor is turned on, while one or more data lines of the half-addressed SRAM cell are disconnected from the read or write circuitry.

In some instances of integrated circuits containing SRAM cell arrays, substantially all of the circuits in the integrated circuit are dedicated to the operation of the SRAM array. In these instances, the circuits which provide the data to be stored in the SRAM array and the circuits which use the data from the SRAM array are located outside the integrated circuit containing the SRAM array. In other instances of integrated circuits containing SRAM cell arrays (e.g. microprocessors, digital signal processors, and wireless telephony controllers), the circuits which provide data to be stored in the SRAM array and the circuits which use data from the SRAM array are located within the integrated circuit.

The NMOS driver and passgate transistors in SRAM cells may be formed in isolated p-wells. Those isolated p-wells are contained in n-type regions, such as deep n-wells. Moreover, those isolated p-wells may be biased independently of other p-type regions within the integrated circuit (e.g. the p-type substrate of the integrated circuit).

Furthermore, an SRAM array containing SRAM cells may be formed so that the isolated p-wells containing the driver and passgate transistors of the half-addressed SRAM cells may be biased independently from the isolated p-wells containing the driver and passgate transistors of the addressed SRAM cells. In such an SRAM array, providing bias increments or decrements to the isolated p-wells of the addressed SRAM cells may improve the write and read margins. In addition, providing bias increments or decrements to the isolated p-wells of the half-addressed SRAM cells may improve data stability.

FIG. 1 is a circuit diagram of an integrated circuit (1000) containing an array (1002) of SRAM cells configured for single sided write and read operations. The SRAM cell array (1002) includes a first SRAM cell (1004) and second SRAM cell (1006) that are located in the same row within the integrated circuit (1000). The first SRAM cell (1004) includes a first bit-side driver transistor (1008) hereafter referred to as the first bit driver (1008). The first bit driver (1008) is formed in a first bit driver isolated p-well (1010) depicted schematically in FIG. 1. The first SRAM cell (1004) also includes a first bit-side load transistor (1012), hereafter referred to as the first bit load (1012). The first bit load (1012) is formed in a first bit load n-well (1014), depicted schematically in FIG. 1. A drain node of the first bit load (1012) and a drain node of the first bit driver (1008) are connected to a first bit-side state node (1016) of the first SRAM cell (1004).

The first SRAM cell (1004) also contains a first bit-bar driver (1018) formed in a first bit-bar driver isolated p-well (1020) and a first bit-bar load (1022) formed in a first bit-bar load n-well (1024). The drain node of the first bit-bar load (1022) and the drain node of the first bit-bar driver (1018) are connected to a first bit-bar-side state node (1026) of the first SRAM cell (1004).

The gate node of the first bit driver (1008) and the gate node of the first bit load (1012) are connected to the first bit-bar-side state node (1026). Conversely, the gate node of the first bit-bar driver (1018) and the gate node of the first bit-bar load (1022) are connected to the first bit-side state node (1016). The source node of the first bit driver (1008) and the source node of the first bit-bar driver (1018) are connected to a first Vss node (1028). Conversely, the source node of the first bit load (1012) and the source node of the first bit-bar load (1022) are connected to a first Vdd node (1030). The first bit-side state node (1016) and the first bit-bar-side state node (1026) are complementary to each other, in that when one state node is at a high state voltage (such as Vdd) the complementary state node is at a low state voltage (such as Vss).

The first SRAM cell (1004) also includes a first bit-side passgate transistor (1032), hereafter referred to as the first bit passgate (1032), formed in a first bit passgate isolated p-well (1034). A first source/drain node of the first bit passgate (1032) is connected to the first bit-side state node (1016). A second source/drain node of the first bit passgate (1032) is connected to a first data line (1036). The first data line (1036) may be connected to other SRAM cells (not shown) in a same column as the first SRAM cell (1004) within the integrated circuit (1000). The gate node of the first bit passgate (1032) is connected to a word line (1038) of the SRAM cell array (1002).

The second SRAM cell (1006) includes a second bit driver (1040) formed in a second bit driver isolated p-well (1042) plus a second bit load (1044) formed in a second bit load n-well (1046). The drain node of the second bit load (1044) and the drain node of the second bit driver (1040) are connected to a second bit-side state node (1048) of the second SRAM cell (1006). The second SRAM cell (1006) also contains a second bit-bar driver (1050) formed in a second bit-bar driver isolated p-well (1052) plus a second bit-bar load (1054) formed in a second bit-bar load n-well (1056). The drain node of the second bit-bar load (1054) and the drain node of the second bit-bar driver (1050) are connected to a second bit-bar-side state node (1058) of the second SRAM cell (1006). A gate node of the second bit driver (1040) and a gate node of the second bit load (1044) are connected to the second bit-bar-side state node (1058).

The gate node of the second bit-bar driver (1050) and the gate node of the second bit-bar load (1054) are connected to the second bit-side state node (1048). The source node of the second bit driver (1040) and the source node of the second bit-bar driver (1050) are connected to a second Vss node (1060). Conversely, the source node of the second bit load (1044) and the source node of the second bit-bar load (1054) are connected to a second Vdd node (1062).

The second SRAM cell (1006) also includes a second bit passgate (1064) formed in a second bit passgate isolated p-well (1066). A first source/drain node of the second bit passgate (1064) is connected to the second bit-side state node (1048). A second source/drain node of the second bit passgate (1064) is connected to a second data line (1068). The second data line (1068) may be connected to other SRAM cells (not shown) in a same column as the second SRAM cell (1006) within the integrated circuit (1000). The gate node of the second bit passgate (1064) is connected to the word line (1038).

In one realization of the instant embodiment, the first bit driver isolated p-well (1010) may be identical with the first bit-bar driver isolated p-well (1020) but separate from the first bit passgate isolated p-well (1034). In an alternate realization, the first bit driver isolated p-well (1010) may be identical with the first bit passgate isolated p-well (1034) but separate from the first bit-bar driver isolated p-well (1020). In a further realization, the first bit-bar driver isolated p-well (1020) may be identical with the first bit passgate isolated p-well (1034) but separate from the first bit driver isolated p-well (1010). In yet another realization, the first bit-bar driver isolated p-well (1020), the first bit passgate isolated p-well (1034), and the first bit driver isolated p-well (1010) may be separate from each other. In each realization, the isolated p-wells (1042), (1052) and (1066) of the second SRAM cell (1006) are configured similarly to the corresponding isolated p-wells (1010), (1020) and (1034) of the first SRAM cell (1004). Also in each realization, the first bit load n-well (1014), the first bit-bar load n-well (1024), the second bit load n-well (1046), and the second bit-bar load n-well (1056) may be coupled to each other through an n-type region (such as a deep n-well).

Figure 2:
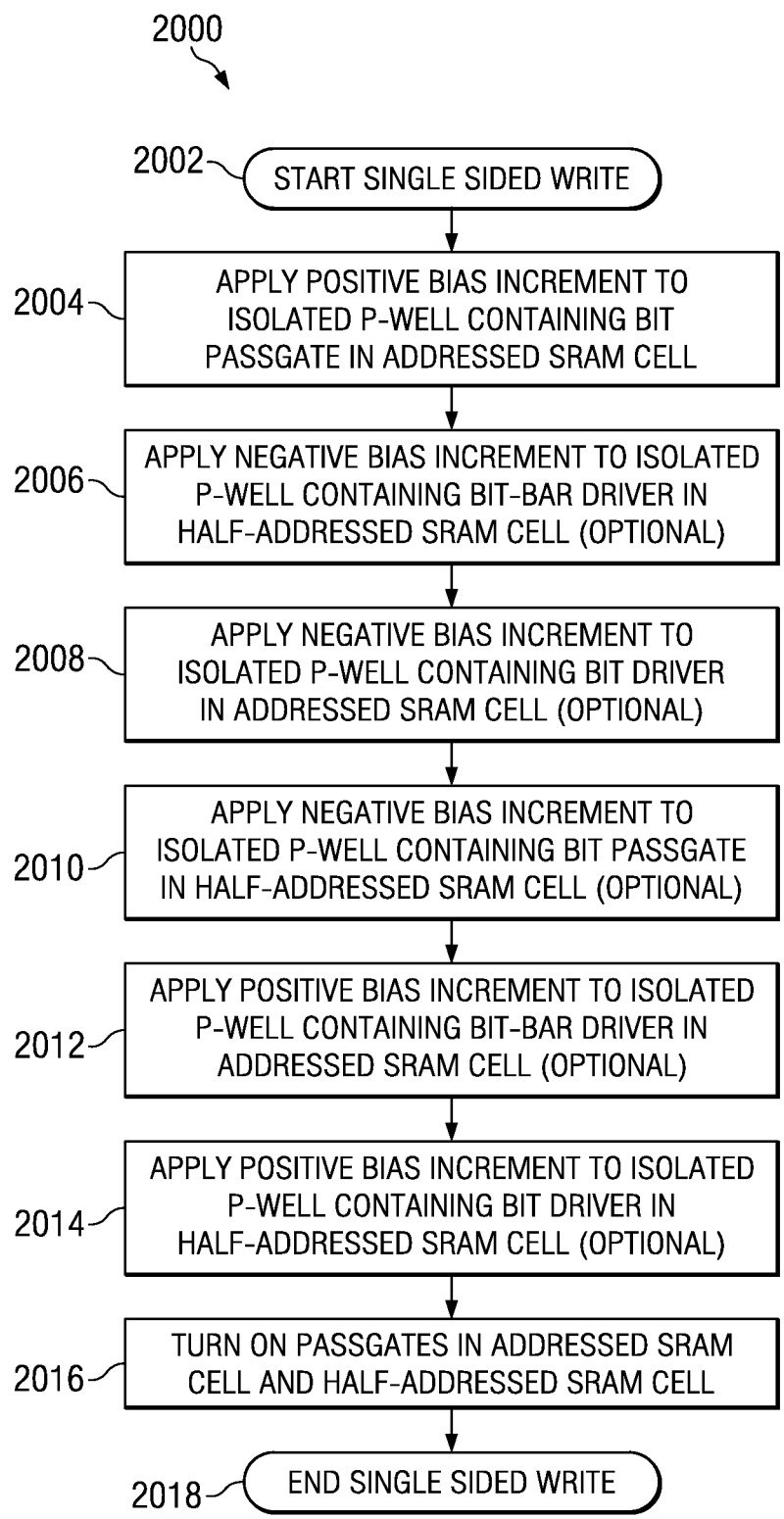
FIG. 2 is a flowchart of a single sided write operation performed on an SRAM cell array as depicted in FIG. 1.

FIG. 2 is a flowchart of a single sided write operation (2000) performed on an SRAM cell array such as the SRAM cell array (1002) depicted in FIG. 1. In this illustrative single sided write operation (2000), the first SRAM cell (1004) is addressed and the second SRAM cell (1006) is half-addressed.

The single sided write operation (2000) begins (2002) with step (2004) that is to apply a positive bias increment to the first bit passgate isolated p-well (1034) containing the first bit passgate (1032) in the addressed SRAM cell (1004). In one realization of the instant embodiment, the positive bias increment may be from 0.10 volts to 0.70 volts.

Then, the optional step (2006) may be executed, which is to apply a negative bias increment to the second bit-bar driver isolated p-well (1052) containing the second bit-bar driver (1050) in the half-addressed SRAM cell (1006). In one realization of the instant embodiment, the magnitude of this negative bias increment may be from 0.10 volts to 50 percent of the difference between Vdd and Vss.

Next, optional step (2008) is to apply a negative bias increment to the first bit driver isolated p-well (1010) containing the first bit driver (1008) in the addressed SRAM cell (1004). In one realization of the instant embodiment, the magnitude of this negative bias increment may be from 0.10 volts to 50 percent of the difference between Vdd and Vss.

Optional step (2010) may then be executed, which is to apply a negative bias increment to the second bit passgate isolated p-well (1066) containing the second bit passgate (1064) in the half-addressed SRAM cell (1006). In one realization of the instant embodiment, the magnitude of this negative bias increment may be from 0.10 volts to 50 percent of the difference between Vdd and Vss.

Then, the optional step (2012) is to apply a positive bias increment to the first bit-bar driver isolated p-well (1020) containing the first bit-bar driver (1018) in the addressed SRAM cell (1004). In one realization of the instant embodiment, this positive bias increment may be from 0.10 volts to 0.70 volts.

Next, optional step (2014) is to apply a positive bias increment to the second bit driver isolated p-well (1042) containing the second bit driver (1040) in the half-addressed SRAM cell (1006). In one realization of the instant embodiment, this positive bias increment may be from 0.10 volts to 0.70 volts.

Subsequently, step (2016) is executed, that is to turn on the first bit passgate (1032) in the addressed SRAM cell (1004) and the second bit passgate (1064) in the half-addressed SRAM cell (1006) (for example, by applying an appropriate signal to the word line (1038)). After step (2016) is executed, the single sided write operation (2000) is ended (2018). It will be recognized that the single sided write operation described in reference to FIG. 2 may also be applied to SRAM cells having additional components than those depicted in FIG. 1 (for example, SRAM cells having bit-bar passgate transistors).

Figure 3:
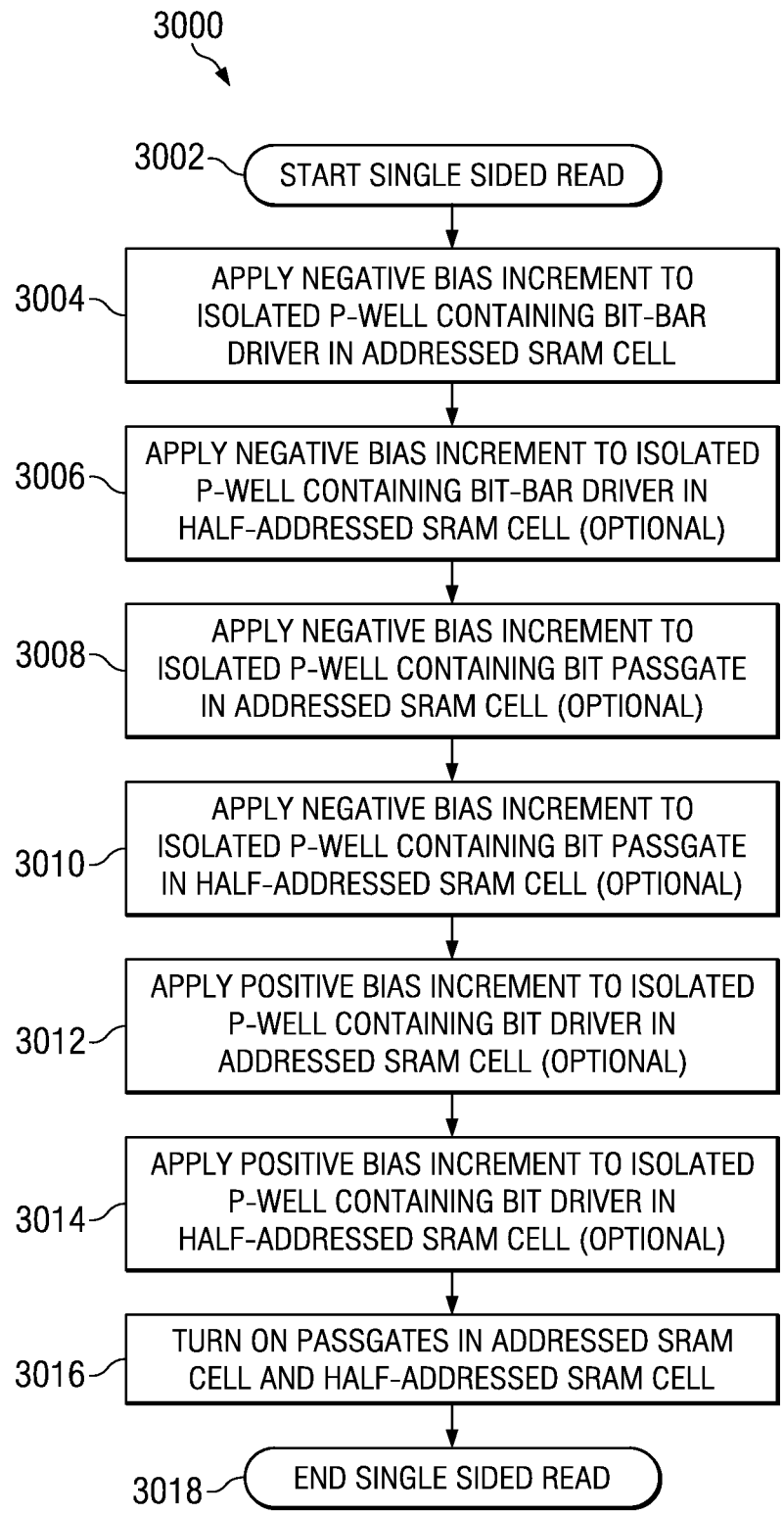
FIG. 3 is a flowchart of a single sided read operation performed on an SRAM cell array as depicted in FIG. 1.

FIG. 3 is a flowchart of a single sided read operation (3000) performed on an SRAM cell array, such as the SRAM cell array (1002) depicted in FIG. 1. In this illustrative single sided read operation (3000), the first SRAM cell (1004) is addressed and the second SRAM cell (1006) is half-addressed. The single sided read operation (3000) begins (3002) with step (3004) that is to apply a negative bias increment to the first bit-bar driver isolated p-well (1020) containing the first bit-bar driver (1018) in the addressed SRAM cell (1004). In one realization of the instant embodiment, the magnitude of this negative bias increment may be from 0.10 volts to 50 percent of the difference between Vdd and Vss.

Then, optional step (3006) may be executed, which is to apply a negative bias increment to the second bit-bar driver isolated p-well (1052) containing the second bit-bar driver (1050) in the half-addressed SRAM cell (1006). In one realization of the instant embodiment, the magnitude of this negative bias increment may be from 0.10 volts to 50 percent of the difference between Vdd and Vss.

Nest, optional step (3008) is to apply a negative bias increment to the first bit passgate isolated p-well (1034) containing the first bit passgate (1032) in the addressed SRAM cell (1004). In one realization of the instant embodiment, the magnitude of this negative bias increment may be from 0.10 volts to 50 percent of the difference between Vdd and Vss.

Optional step (3010) may then be executed, which is to apply a negative bias increment to the second bit passgate isolated p-well (1066) containing the second bit passgate (1064) in the half-addressed SRAM cell (1006). In one realization of the instant embodiment, the magnitude of this negative bias increment may be from 0.10 volts to 50 percent of the difference between Vdd and Vss.

Then, optional step (3012) is to apply a positive bias increment to the first bit driver isolated p-well (1010) containing the first bit driver (1008) in the addressed SRAM cell (1004). In one realization of the instant embodiment, the positive bias increment may be from 0.10 volts to 0.70 volts.

Next, optional step (3014) is to apply a positive bias increment to the second bit driver isolated p-well (1042) containing the second bit driver (1040) in the half-addressed SRAM cell (1006). In one realization of the instant embodiment, the positive bias increment may be from 0.10 volts to 0.70 volts.

Subsequently, step (3016) is executed, that is to turn on the first bit passgate (1032) in the addressed SRAM cell (1004) and the second bit passgate (1064) in the half-addressed SRAM cell (1006) (for example, by applying an appropriate signal to the word line (1038)). After step (3016) is executed, the single sided read operation (3000) is ended (3018). It will be recognized that the single sided read operation described in reference to FIG. 3 may also be applied to SRAM cells having additional components than those depicted in FIG. 1 (for example, SRAM cells having bit-bar passgate transistors).

Figure 4:
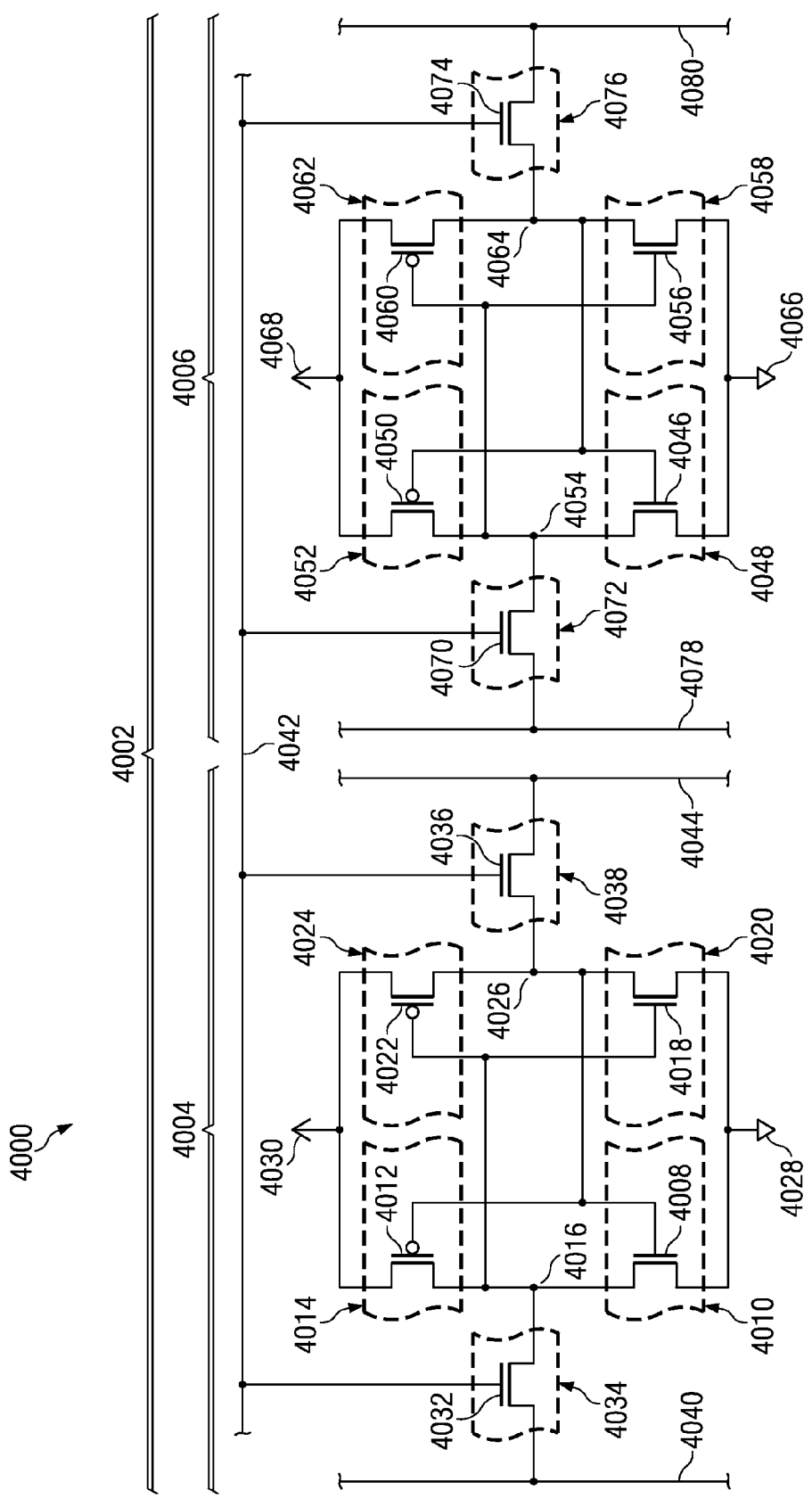
FIG. 4 is a circuit diagram of an integrated circuit containing an array of SRAM cells configured for double sided write and read operations.

FIG. 4 is a circuit diagram of an integrated circuit (4000) containing an array (4002) of SRAM cells configured for double sided write and read operations. The SRAM cell array (4002) includes a first SRAM cell (4004) and a second SRAM cell (4006) that is located within the integrated circuit (4000) in a same row as the first SRAM cell (4004). The first SRAM cell (4004) includes a first bit driver (4008) formed in a first bit driver isolated p-well (4010). The first SRAM cell (4004) also includes a first bit load (4012) formed in a first bit load n-well (4014). The drain node of the first bit load (4012) and the drain node of the first bit driver (4008) are connected to a first bit-side state node (4016) of the first SRAM cell (4004). The first SRAM cell (4004) also contains a first bit-bar driver (4018) formed in a first bit-bar driver isolated p-well (4020) and a first bit-bar load (4022) formed in a first bit-bar load n-well (4024). The drain node of the first bit-bar load (4022) and the drain node of the first bit-bar driver (4018) are connected to a first bit-bar-side state node (4026) of the first SRAM cell (4004).

Furthermore, the gate node of the first bit driver (4008) and the gate node of the first bit load (4012) are connected to the first bit-bar-side state node (4026). In addition, the gate node of the first bit-bar driver (4018) and the gate node of the first bit-bar load (4022) are connected to the first bit-side state node (4016). The source node of the first bit driver (4008) and the source node of the first bit-bar driver (4018) are connected to a first Vss node (4028). A source node of the first bit load (4012) and a source node of the first bit-bar load (4022) are connected to a first Vdd node (4030). It is to be noted that the first bit-side state node (4016) and the first bit-bar-side state node (4026) are complementary to each other.

The first SRAM cell (4004) includes a first bit passgate (4032), formed in a first bit passgate isolated p-well (4034) and a first bit-bar passgate (4036) formed in a first bit-bar passgate isolated p-well (4038). A first source/drain node of the first bit passgate (4032) is connected to the first bit-side state node (4016). A second source/drain node of the first bit passgate (4032) is connected to a first bit data line (4040). The first bit data line (4040) may be connected to the first bit passgate of other SRAM cells in a same column as the first SRAM cell (4004) within the integrated circuit (4000). The gate node of the first bit passgate (4032) is connected to a word line (4042) of the SRAM cell array (4002).

Similarly, a first source/drain node of the first bit-bar passgate (4036) is connected to the first bit-bar-side state node (4026). A second source/drain node of the first bit-bar passgate (4036) is connected to a first bit-bar data line (4044). The first bit-bar data line (4044) may be connected to the first bit-bar passgate of other SRAM cells in a same column as the first SRAM cell (4004) within the integrated circuit (4000). The gate node of the first bit-bar passgate (4036) is connected to the word line (4042).

The second SRAM cell (4006) includes a second bit driver (4046) formed in a second bit driver isolated p-well (4048), plus a second bit load (4050) formed in a second bit load n-well (4052). The drain node of the second bit load (4050) and the drain node of the second bit driver (4046) are connected to a second bit-side state node (4054) of the second SRAM cell (4006). The second SRAM cell (4006) also contains a second bit-bar driver (4056) formed in a second bit-bar driver isolated p-well (4058), plus a second bit-bar load (4060) formed in a second bit-bar load n-well (4062). The drain node of the second bit-bar load (4060) and the drain node of the second bit-bar driver (4056) are connected to a second bit-bar-side state node (4064) of the second SRAM cell (4006).

The gate node of the second bit driver (4046) and the gate node of the second bit load (4050) are connected to the second bit-bar-side state node (4064). Conversely, the gate node of the second bit-bar driver (4056) and the gate node of the second bit-bar load (4060) are connected to the second bit-side state node (4054). The source node of the second bit driver (4046) and the source node of the second bit-bar driver (4056) are connected to a second Vss node (4066). Conversely, the source node of the second bit load (4050) and the source node of the second bit-bar load (4060) are connected to a second Vdd node (4068).

The second SRAM cell (4006) also includes a second bit passgate (4070) formed in a second bit passgate isolated p-well (4072), plus a second bit-bar passgate (4074) formed in a second bit-bar passgate isolated p-well (4076). A first source/drain node of the second bit passgate (4070) is connected to the second bit-side state node (4054). A second source/drain node of the second bit passgate (4070) is connected to a second bit-side data line (4078). The second bit-side data line (4078) may be connected to the second bit passgate of other SRAM cells in a same column as the second SRAM cell (4006). The gate node of the second bit passgate (4070) is connected to the word line (4042).

Moreover, a first source/drain node of the second bit-bar passgate (4074) is connected to the second bit-bar-side state node (4064). A second source/drain node of the second bit-bar passgate (4074) is connected to a second bit-bar-side data line (4080). The second bit-bar-side data line (4080) may be connected to the second bit-bar passgate other SRAM cells in a same column as the second SRAM cell (4006). The gate node of the second bit-bar passgate (4074) is connected to the word line (4042).

In one realization of the instant embodiment, the first bit driver isolated p-well (4010) may be identical with the first bit-bar driver isolated p-well (4020). Plus, the first bit passgate isolated p-well (4034) may be identical with the first bit-bar passgate isolated p-well (4038) but separate from the first bit driver isolated p-well (4010).

In an alternate realization, the first bit driver isolated p-well (4010) may be identical with the first bit passgate isolated p-well (4034). Plus, the first bit-bar driver isolated p-well (4020) may be identical with the first bit-bar passgate isolated p-well (4038) but separate from the first bit driver isolated p-well (4010).

In a further realization, the first bit-bar driver isolated p-well (4020) may be identical with the first bit passgate isolated p-well (4034). Plus, the first bit driver isolated p-well (4010) may be identical with the first bit-bar passgate isolated p-well (4038) but separate from the first bit-bar driver isolated p-well (4020).

In yet another realization, the first bit driver isolated p-well (4010), the first bit-bar driver isolated p-well (4020), the first bit passgate isolated p-well (4034), and the first bit-bar passgate isolated p-well (4038) may be separate from each other. In each realization, the isolated p-wells (4048), (4058), (4072) and (4076) in the second SRAM cell (4006) are configured similarly to the corresponding isolated p-wells (4010), (4020), (4034) and (4038) of the first SRAM cell (4004).

Also in each realization, the first bit load n-well (4014), the first bit-bar load n-well (4024), the second bit load n-well (4052), and the second bit-bar load n-well (4062) may be coupled to each other through an n-type region (such as a deep n-well).

Figure 5:
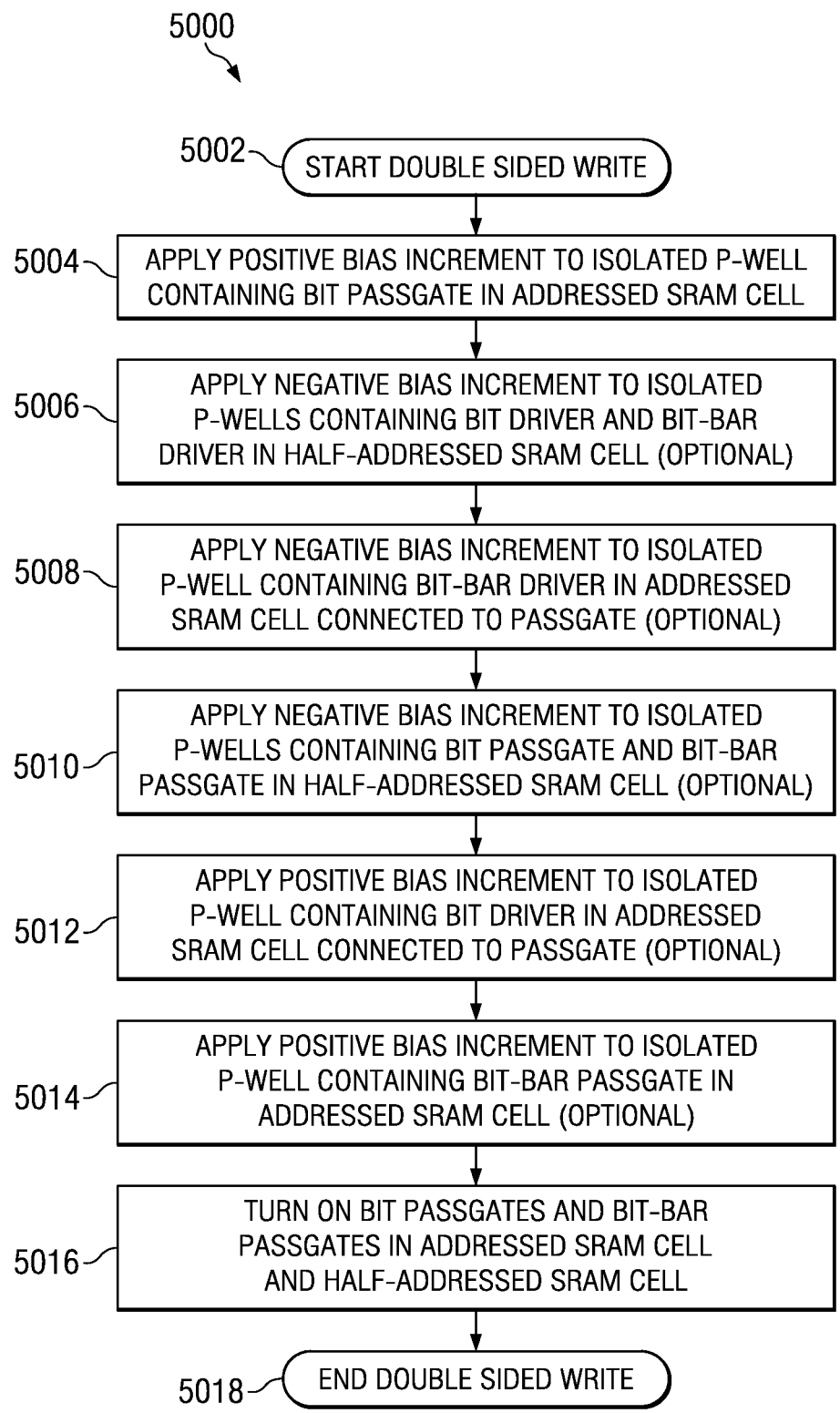
FIG. 5 is a flowchart of a double sided write operation performed on an SRAM cell array as depicted in FIG. 4.

FIG. 5 is a flowchart of a double sided write operation (5000) performed on an SRAM cell array such as the SRAM cell array (4002) depicted in FIG. 4. In this double sided write operation (5000), the first SRAM cell (4004) is addressed and the second SRAM cell (4006) is half-addressed. Furthermore, in a double sided write operation, one data line is biased to a high write voltage (such as Vdd) while the complementary data line is biased to a low write voltage (such as Vss). In the following discussion of the double sided write operation (5000) in reference to FIG. 5, the first bit data line (4040) of the addressed SRAM cell (4004) will be presumed to be biased to the low write voltage and the first bit-bar data line (4044) of the addressed SRAM cell (4004) will be presumed to be biased to the high write voltage. It will be recognized that the discussion in reference to FIG. 5 may also be applied to a double sided write operation of the opposite polarity (with appropriate exchanges of biases applied to the isolated p-wells containing the NMOS transistors between the bit and bit-bar sides of the SRAM cells).

The double sided write operation (5000) begins (5002) with step (5004) that is to apply a positive bias increment to the first bit passgate isolated p-well (4034) containing the first bit passgate (4032) in the addressed SRAM cell (4004). The first bit passgate (4032) is connected to the first bit data line (4040), which is in turn biased to the low write voltage. In one realization of the instant embodiment, the positive bias increment may be from 0.10 volts to 0.70 volts.

Then, optional step (5006) is to apply a negative bias increment to the second bit driver isolated p-well (4048) containing the second bit driver (4046) of the half-addressed SRAM cell (4006). A negative bias increment is also applied to the second bit-bar driver isolated p-well (4058) containing the second bit-bar driver (4056) of the half-addressed SRAM cell (4006). In one realization of the instant embodiment, the magnitude of the negative bias increments may be from 0.10 volts to 50 percent of a difference between Vdd and Vss. Moreover, the negative bias increment applied to the second bit driver isolated p-well (4048) may differ from the negative bias increment applied to the second bit-bar driver isolated p-well (4058).

Next optional step (5008) is to apply a negative bias increment to the first bit-bar driver isolated p-well (4020) containing the first bit-bar driver (4018) in the addressed SRAM cell (4004). It is to be noted that the first bit-bar driver (4018) is connected to the first bit-bar passgate (4036). The first bit-bar passgate (4036) is connected to the first bit-bar data line (4044), which is in turn biased to the high write voltage. In one realization of the instant embodiment, the magnitude of the negative bias increment may be from 0.10 volts to 50 percent of the difference between Vdd and Vss.

Optional step (5010) may then be executed, which is to apply a negative bias increment to the second bit passgate isolated p-well (4072) containing the second bit passgate (4070) in the half-addressed SRAM cell (4006). A negative bias increment is also be applied to the second bit-bar passgate isolated p-well (4076) containing the second bit-bar passgate (4074) in the half-addressed SRAM cell (4006). In one realization of the instant embodiment, the magnitude of the negative bias increment may be from 0.10 volts to 50 percent of the difference between Vdd and Vss. Moreover, the negative bias increment applied to the second bit passgate isolated p-well (4072) may differ from the negative bias increment applied to the second bit-bar passgate isolated p-well (4076).

Next, optional step (5012) is to apply a positive bias increment to the first bit driver isolated p-well (4010) containing the first bit driver (4008) in the addressed SRAM cell (4004). In one realization of the instant embodiment, the positive bias increment may be from 0.10 volts to 0.70 volts.

Then, optional step (5014) is to apply a positive bias increment to the first bit-bar passgate isolated p-well (4038) containing the first bit-bar passgate (4036) in the addressed SRAM cell (4004). In one realization of the instant embodiment, the positive bias increment may be from 0.10 volts to 0.70 volts.

Subsequently, step (5016) is executed, which is to turn on the first bit passgate (4032) in the addressed SRAM cell (4004), the first bit-bar passgate (4036) in the addressed SRAM cell (4004), the second bit passgate (4070) in the half-addressed SRAM cell (4006), the second bit-bar passgate (4074) in the half-addressed SRAM cell (4006) (for example, by applying an appropriate signal to the word line (4042)). After step (5016) is executed, the double sided write operation (5000) is ended at step (5018). It will be recognized that the double sided write operation described in reference to FIG. 5 may also be applied to SRAM cells having additional components than those depicted in FIG. 4 (for example, additional read or write ports).

Figure 6:
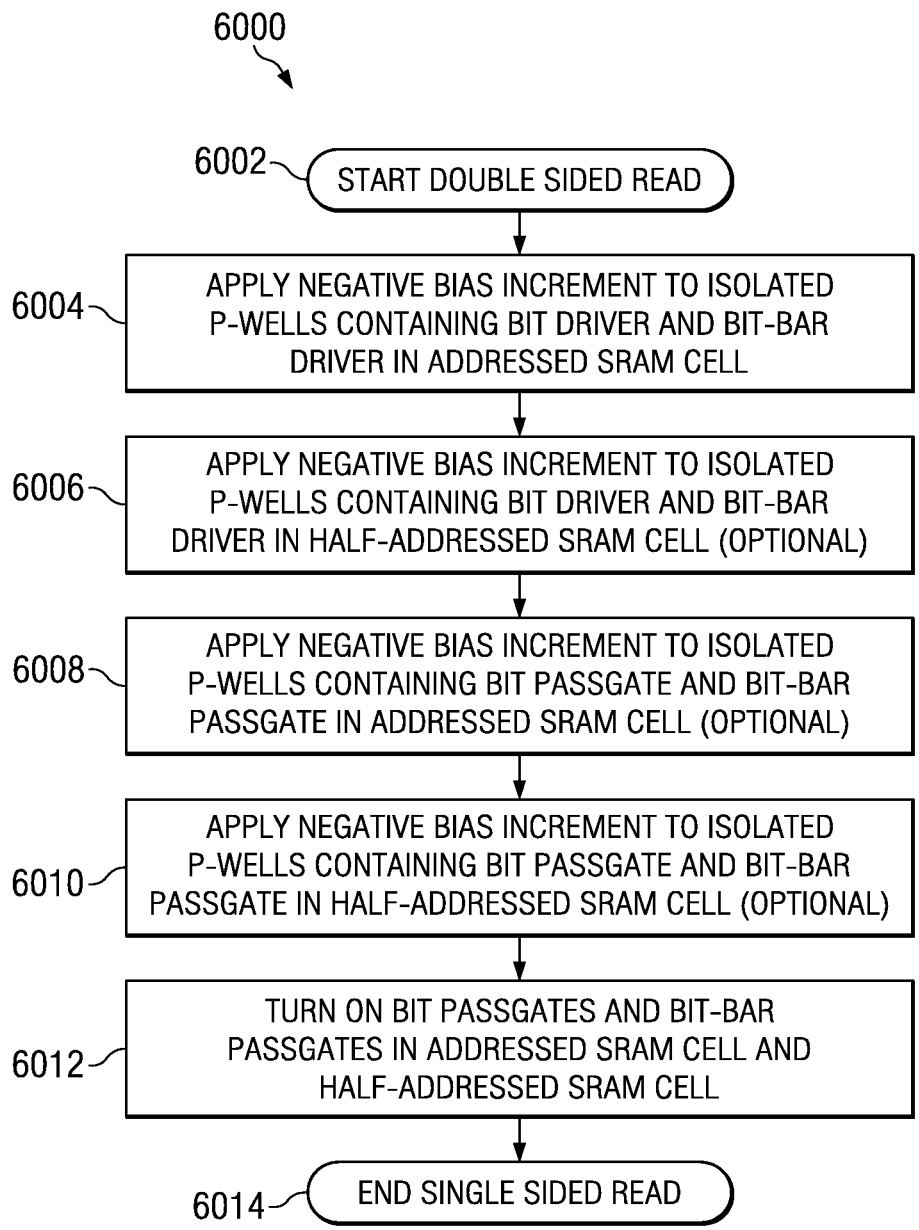
FIG. 6 is a flowchart of a double sided read operation performed on an SRAM cell array as depicted in FIG. 4.

FIG. 6 is a flowchart of a double sided read operation (6000) performed on an SRAM cell array such as the SRAM cell array (4002) depicted in FIG. 4. In this double sided read operation (6000), the first SRAM cell (4004) is addressed and the second SRAM cell (4006) is half-addressed. The double sided read operation (6000) begins (6002) with step (6004) that is to apply a negative bias increment to the first bit driver isolated p-well (4010) containing the first bit driver (4008) in the addressed SRAM cell (4004). A negative bias increment is also applied to the first bit-bar driver isolated p-well (4020) containing the first bit-bar driver (4018) in the addressed SRAM cell (4004). In one realization of the instant embodiment, the magnitude of the negative bias increment may be from 0.10 volts to 50 percent of the difference between Vdd and Vss. Moreover, the negative bias increment applied to the second bit driver isolated p-well (4010) may differ from the negative bias increment applied to the first bit-bar driver isolated p-well (4020).

Next, optional step (6006) is to apply a negative bias increment to the second bit driver isolated p-well (4048) containing the second bit driver (4046) in the half-addressed SRAM cell (4006). A negative bias increment is also applied to the second bit-bar driver isolated p-well (4058) containing the second bit-bar driver (4056) in the half-addressed SRAM cell (4006). In one realization of the instant embodiment, the magnitude of the negative bias increment may be from 0.10 volts to 50 percent of the difference between Vdd and Vss. Moreover, the negative bias increment applied to the second bit driver isolated p-well (4048) may differ from the negative bias increment applied to the second bit-bar driver isolated p-well (4058).

Then, optional step (6008) is to apply a negative bias increment to the first bit passgate isolated p-well (4034) containing the first bit passgate (4032) in the addressed SRAM cell (4004). A negative bias increment is also applied to the first bit-bar passgate isolated p-well (4038) containing the first bit-bar passgate (4036) in the addressed SRAM cell (4004). In one realization of the instant embodiment, the magnitude of the negative bias increment may be from 0.10 volts to 50 percent of the difference between Vdd and Vss. Moreover, the negative bias increment applied to the first bit passgate isolated p-well (4034) may differ from the negative bias increment applied to the first bit-bar passgate isolated p-well (4038).

Optional step (6010) may then be executed, which is to apply a negative bias increment to the second bit passgate isolated p-well (4072) containing the second bit passgate (4070) in the half-addressed SRAM cell (4006). A negative bias increment is also applied to the second bit-bar passgate isolated p-well (4076) containing the second bit-bar passgate (4074) in the half-addressed SRAM cell (4006). In one realization of the instant embodiment, the magnitude of the negative bias increment may be from 0.10 volts to 50 percent of the difference between Vdd and Vss. Moreover, the negative bias increment applied to the second bit passgate isolated p-well (4072) may differ from the negative bias increment applied to the second bit-bar passgate isolated p-well (4076).

Subsequently, step (6012) is executed, which is to turn on the first bit passgate (4032) in the addressed SRAM cell (4004), the first bit-bar passgate (4036) in the addressed SRAM cell (4004), the second bit passgate (4070) in the half-addressed SRAM cell (4006), and the second bit-bar passgate (4074) in the half-addressed SRAM cell (4006) (for example, by applying an appropriate signal to the word line (4042)). After step (6012) is executed, the double sided read operation (6000) is ended at step (6018). It will be recognized that the double sided read operation described in reference to FIG. 6 may be applied to SRAM cells having additional components than those depicted in FIG. 4 (for example, additional read or write ports).

Figure 7:
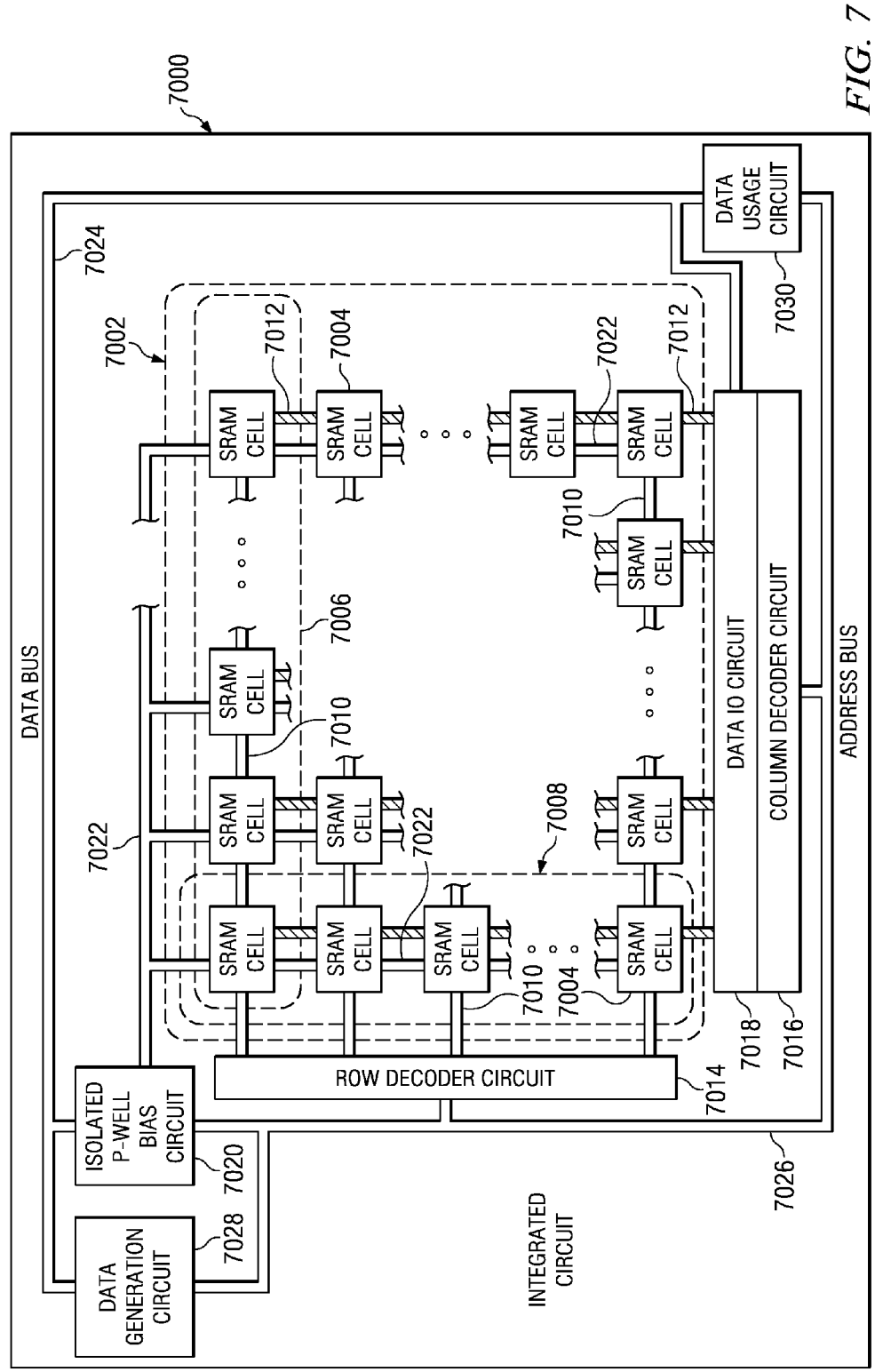
FIG. 7 depicts an integrated circuit containing an SRAM cell array that includes SRAM cells formed according to an embodiment.

FIG. 7 depicts an integrated circuit (7000) containing an SRAM cell array (7002) which includes SRAM cells (7004) formed according to an embodiment. The SRAM cells (7004) are arranged in rows (7006) and columns (7008). Each word line (7010) is connected to SRAM cells (7004) in a row (7006). Each data line bus (7012) is connected to SRAM cells (7004) in a column (7008). Each data line bus (7012) may include one or more bit data lines or bit-bar data lines. A row decoder circuit (7014) applies appropriate biases to the word lines (7010). A column decoder circuit (7016) applies appropriate biases to the bit data lines or bit-bar data lines within the data line buses (7012). A data input/output (IO) circuit (7018)

reads data from the data line buses (7012) during read operations. The data input/output (10) circuit (7018) also applies appropriate potentials to the data line buses (7012) during write operations.

An isolated p-well bias circuit (7020) applies biases to an isolated p-well bus (7022) that is connected to the isolated p-wells within the SRAM cells (7004). The isolated p-well bias circuit (7020) is capable of biasing the isolated p-wells independently by column (7008). The isolated p-well bias circuit (7020) may further be capable of independently biasing the separate isolated p-wells in each SRAM cell (7004).

The integrated circuit further includes a data bus (7024) that carries data bits between the SRAM cell array (7002) and other circuits in the integrated circuit (7000). An address bus (7026) is used to select SRAM cells (7004) in the SRAM cell array (7002) for read and write operations. The address bus (7026) is connected to the row decoder circuit (7014), the column decoder circuit (7016), and the isolated p-well bias circuit (7020).

The integrated circuit (7000) may also contain a data generation circuit (7028) that is coupled to the data bus (7024) and the address bus (7026). The data generation circuit (7028) produces incoming data bits for storage in the SRAM cell array (7002). Then, the data bus (7024) carries the incoming data bits from the data generation circuit (7028) to the SRAM cell array (7002).

In addition, the integrated circuit (7000) may contain a data usage circuit (7030) that connects to the data bus (7024) and address bus (7026). The data usage circuit (7030) uses outgoing data bits that were stored in the SRAM cell array (7002). Generally, the data bus (7024) carries the outgoing data bits from the SRAM cell array (7002) to the data usage circuit (7030).

While various embodiments have been described above, it should be understood that they have been presented by way of example only and not limitation. Numerous changes to the disclosed embodiments can be made in accordance with the disclosure herein without departing from the spirit or scope of those embodiments. Thus, the breadth and scope of the embodiments should be defined in accordance with the following claims.

What is claimed is:

1. A process of performing a single sided write operation, comprising:
applying a positive bias increment to a bit passgate isolated p-well containing an NMOS bit passgate of an addressed SRAM cell, said positive bias increment being between 0.10 volts and 0.70 volts, and said bit passgate isolated p-well of said addressed SRAM cell being controlled independently from a bit driver isolated p-well of said addressed SRAM cell;
turning on said NMOS bit passgate of said addressed SRAM cell after said step of applying said positive bias increment; and
turning on an NMOS bit passgate of a half-addressed SRAM cell.

2. The process of claim 1, wherein a negative bias increment is applied to a bit-bar driver isolated p-well containing an NMOS bit-bar driver in said half-addressed SRAM cell before said steps of turning on said bit passgate of said addressed and half-addressed SRAM cells, said negative bias increment having a magnitude between 0.10 volts and 50 percent of a difference between Vdd and Vss.

3. The process of claim 1, wherein a negative bias increment is applied to said bit driver isolated p-well containing an NMOS bit driver in said addressed SRAM cell before said steps of turning on said bit passgate of said addressed and half-addressed SRAM cells, said negative bias increment having a magnitude between 0.10 volts and 50 percent of a difference between Vdd and Vss.

4. The process of claim 1, wherein a negative bias increment is applied to a bit passgate isolated p-well containing said NMOS bit passgate in said half-addressed SRAM cell before said steps of turning on said bit passgate of said addressed and half-addressed SRAM cells, said negative bias increment having a magnitude between 0.10 volts and 50 percent of a difference between Vdd and Vss.

5. The process of claim 1, wherein a positive bias increment is applied to a bit-bar driver isolated p-well containing a bit-bar driver in said addressed SRAM cell before said steps of turning on said bit passgate of said addressed and half-addressed SRAM cells, said positive bias increment being between 0.10 volts and 0.70 volts.

6. The process of claim 1, wherein a positive bias increment is applied to a bit driver isolated p-well containing a bit driver in said half-addressed SRAM cell before said steps of turning on said bit passgate of said addressed and half-addressed SRAM cells, said positive bias increment being between 0.10 volts and 0.70 volts.

7. A process of performing a single sided read operation, comprising:
applying a negative bias increment to a bit-bar driver isolated p-well containing an NMOS bit-bar driver of an addressed SRAM cell, said negative bias increment having a magnitude between 0.10 volts and 50 percent of a difference between Vdd and Vss, and said bit-bar driver isolated p-well of said addressed SRAM cell being controlled independently from a bit driver isolated p-well of said addressed SRAM cell;
turning on a bit passgate in said addressed SRAM cell; and
turning on a bit passgate in a half-addressed SRAM cell.

8. The process of claim 7, wherein a negative bias increment is applied to a bit-bar driver isolated p-well containing an NMOS bit-bar driver in said half-addressed SRAM cell before said steps of turning on said bit passgate of said addressed and half-addressed SRAM cells, said negative bias increment having a magnitude between 0.10 volts and 50 percent of a difference between Vdd and Vss.

9. The process of claim 7, wherein a negative bias increment is applied to a bit passgate isolated p-well containing said bit passgate in said addressed SRAM cell of said array of SRAM cells before said steps of turning on said bit passgate of said addressed and half-addressed SRAM cells, said negative bias increment having a magnitude between 0.10 volts and 50 percent of a difference between Vdd and Vss.

10. The process of claim 7, wherein a negative bias increment is applied to a bit passgate isolated p-well containing said bit passgate in said half-addressed SRAM cell before said steps of turning on said bit passgate of said addressed and half-addressed SRAM cells, said negative bias increment has a magnitude between 0.10 volts and 50 percent of a difference between Vdd and Vss.

11. The process of claim 7, wherein a positive bias increment is applied to said bit driver isolated p-well containing a bit driver in said addressed SRAM cell of said array of SRAM cells before said steps of turning on said bit passgate of said addressed and half-addressed SRAM cells, said positive bias increment being between 0.10 volts and 0.70 volts.

12. The process of claim 7, wherein a positive bias increment is applied to a bit driver isolated p-well containing a bit driver in said half-addressed SRAM cell before said steps of turning on said bit passgate of said addressed and half-addressed SRAM cells, said positive bias increment being between 0.10 volts and 0.70 volts.

13. A process of performing a double sided write operation, comprising:
   applying a low write voltage to a bit data line of an addressed SRAM cell, said bit data line being coupled to a bit passgate of said addressed SRAM cell;
   applying a high write voltage to a bit-bar data line of said addressed SRAM cell, said bit-bar data line being coupled to a bit-bar passgate of said addressed SRAM cell;
   applying a positive bias increment to a bit passgate isolated p-well containing said bit passgate of said addressed SRAM cell, said positive bias increment being between 0.10 volts and 0.70 volts, and said bit passgate isolated p-well of said addressed SRAM cell being controlled independently from a bit-bar driver isolated p-well of said addressed SRAM cell;
   turning on said bit passgate in said addressed SRAM cell;
   turning on said bit-bar passgate in said addressed SRAM cell;
   turning on a bit passgate in a half-addressed SRAM cell; and
   turning on a bit-bar passgate in said half-addressed SRAM cell.

14. The process of claim 13, wherein a negative bias increment is applied to a bit driver isolated p-well containing an NMOS bit driver in said half-addressed SRAM cell and to a bit-bar driver isolated p-well containing an NMOS bit-bar driver in said half-addressed SRAM cell before said steps of turning on said bit passgate and said bit-bar passgate of said addressed and half-addressed SRAM cells, said negative bias increment having a magnitude between 0.10 volts and 50 percent of a difference between Vdd and Vss.

15. The process of claim 13, wherein a negative bias increment is applied to said bit-bar driver isolated p-well containing an NMOS bit-bar driver in said addressed SRAM cell before said steps of turning on said bit passgate and said bit-bar passgate of said addressed and half-addressed SRAM cells before said steps of turning on said bit passgate and said bit-bar passgate of said addressed and half-addressed SRAM cells, said negative bias increment having a magnitude between 0.10 volts and 50 percent of a difference between Vdd and Vss.

16. The process of claim 13, wherein a negative bias increment is applied to a bit passgate isolated p-well containing a bit passgate in said half-addressed SRAM cell and to a bit-bar passgate isolated p-well containing a bit-bar passgate in said half-addressed SRAM cell before said steps of turning on said bit passgate and said bit-bar passgate of said addressed and half-addressed SRAM cells, said negative bias increment having a magnitude between 0.10 volts and 50 percent of a difference between Vdd and Vss.

17. The process of claim 13, wherein a positive bias increment is applied to a bit driver isolated p-well containing an NMOS bit driver in said addressed SRAM cell before said steps of turning on said bit passgate and said bit-bar passgate of said addressed and half-addressed SRAM cells, said positive bias increment being between 0.10 volts and 0.70 volts.

18. The process of claim 13, wherein a positive bias increment is applied to a bit-bar passgate isolated p-well containing said bit-bar passgate in said addressed SRAM cell before said steps of turning on said bit passgate and said bit-bar passgate of said addressed and half-addressed SRAM cells, said positive bias increment being between 0.10 volts and 0.70 volts.

19. A process of performing a double sided read operation, comprising:
   applying a negative bias increment to a bit driver isolated p-well containing an NMOS bit driver of an addressed SRAM cell and to a bit-bar driver isolated p-well containing an NMOS bit-bar driver of said addressed SRAM cell, said bias increment being between 0.10 volts and 0.70 volts, and said bit driver isolated p-well and said bit-bar driver isolated p-well of said addressed SRAM cell being controlled independently from a bit passgate isolated p-well of said addressed SRAM cell;
   turning on a bit passgate in said addressed SRAM cell;
   turning on a bit-bar passgate in said addressed SRAM cell;
   turning on a bit passgate in a half-addressed SRAM cell; and
   turning on a bit-bar passgate in said half-addressed SRAM cell.

20. The process of claim 19, wherein a negative bias increment is applied to a bit driver isolated p-well containing a bit driver in said half-addressed SRAM cell and to a bit-bar driver isolated p-well containing a bit-bar driver in said half-addressed SRAM cell before said steps of turning on said bit passgate and said bit-bar passgate of said addressed and half-addressed SRAM cells, said negative bias increment having a magnitude between 0.10 volts and 50 percent of a difference between Vdd and Vss.

21. The process of claim 19, wherein a negative bias increment is applied to said bit passgate isolated p-well containing said bit passgate in said addressed SRAM cell and to a bit-bar passgate isolated p-well containing said bit-bar passgate in said addressed SRAM cell before said steps of turning on said bit passgate and said bit-bar passgate of said addressed and half-addressed SRAM cells, said negative bias increment having a magnitude between 0.10 volts and 50 percent of a difference between Vdd and Vss.

22. The process of claim 19 wherein a negative bias increment is applied to a bit passgate isolated p-well containing a bit passgate in said half-addressed SRAM cell and to a bit-bar passgate isolated p-well containing a bit-bar passgate in said half-addressed SRAM cell before said steps of turning on said bit passgate and said bit-bar passgate of said addressed and half-addressed SRAM cells, said negative bias increment having a magnitude between 0.10 volts and 50 percent of a difference between Vdd and Vss.

23. An integrated circuit, comprising:
   an array of SRAM cells arranged in rows and columns;
   each SRAM cell of said array of SRAM cells containing a bit passgate isolated p-well, a bit driver isolated p-well, and a bit-bar driver isolated p-well; and
   an isolated p-well bias circuit coupled to said array of SRAM cells, said isolated p-well bias circuit being capable of independently biasing said bit passgate isolated p-well, said bit driver isolated p-well, and said bit-bar driver isolated p-well of said each SRAM cell.

24. The integrated circuit of claim 23, wherein said isolated p-well bias circuit is capable of independently biasing said bit passgate isolated p-well, said bit driver isolated p-well, and said bit-bar driver isolated p-well by said SRAM cell column.

25. The integrated circuit of claim 23, wherein said SRAM cell further includes a bit-bar passgate isolated p-well.

26. The integrated circuit of claim 25, wherein said isolated p-well bias circuit is capable of independently biasing said bit passgate isolated p-well, said bit driver isolated p-well, said bit-bar driver isolated p-well, and said bit-bar passgate isolated p-well by said SRAM cell column.

* * * * *